United States Patent
Rehm et al.

(10) Patent No.: US 7,408,833 B2
(45) Date of Patent: Aug. 5, 2008

(54) SIMULATING A FLOATING WORDLINE CONDITION IN A MEMORY DEVICE, AND RELATED TECHNIQUES

(75) Inventors: Norbert Rehm, Apex, NC (US); Jan Zieleman, Cary, NC (US); Robert Perry, Cary, NC (US)

(73) Assignee: Infineon Technologies AG, Neubiberg (DE)

( * ) Notice: Subject to any disclaimer, the term of this patent is extended or adjusted under 35 U.S.C. 154(b) by 138 days.

(21) Appl. No.: 11/437,669

(22) Filed: May 22, 2006

(65) Prior Publication Data

US 2006/0209617 A1    Sep. 21, 2006

Related U.S. Application Data

(62) Division of application No. 10/969,343, filed on Oct. 21, 2004, now Pat. No. 7,085,191.

(51) Int. Cl.
*G11C 8/00* (2006.01)

(52) U.S. Cl. .............. 365/230.06; 365/189.05; 365/210

(58) Field of Classification Search ............. 365/230.06, 365/189.05, 210
See application file for complete search history.

(56) References Cited

U.S. PATENT DOCUMENTS

| | | | |
|---|---|---|---|
| 4,982,364 A | 1/1991 | Iwahashi | |
| 5,896,327 A * | 4/1999 | Yang | 365/200 |
| 6,304,488 B1 * | 10/2001 | Abedifard et al. | 365/185.23 |
| 6,580,649 B2 | 6/2003 | Park | |
| 6,795,331 B2 | 9/2004 | Noro | |
| 6,829,183 B2 | 12/2004 | Braceras | |
| 7,180,787 B2 * | 2/2007 | Hosono et al. | 365/185.24 |

\* cited by examiner

*Primary Examiner*—Son Dinh
(74) *Attorney, Agent, or Firm*—Edell, Shapiro & Finnan, LLC

(57) ABSTRACT

A memory device and methods to exploit extra or dummy wordlines in the memory device, wherein the extra wordlines are not part of a main memory area of the memory device but, when activated, connect their attached memory cells to the bitlines of the main memory area. The extra wordlines are connected to a voltage in such a manner so as to simulate a floating wordline condition. Associated with each extra wordline is a driver circuit that connects the extra wordline to a voltage to allow it to charge up to the voltage, and subsequently disconnects the wordline from the voltage to allow it to float. While the extra wordline is floating, measurements may be made on the memory device to gather data useful for testing production memory chips for floating wordline conditions. According to another aspect, one or more extra wordlines may be activated to connect its attached memory cells to bitlines, thereby increasing the capacitance on the bitlines. This is useful during certain test mode conditions of a memory device, or on a more permanent basis to enhance the performance of the memory device.

12 Claims, 4 Drawing Sheets

SIMULATING A FLOATING WORDLINE CONDITION IN A MEMORY DEVICE, AND RELATED TECHNIQUES

CROSS REFERENCE TO RELATED APPLICATIONS

This application is a divisional of U.S. patent application Ser. No. 10/969,343, filed Oct. 21, 2004 now U.S. Pat. No. 7,085,191, entitled "Simulating a Floating Wordline Condition in a Memory Device, and Related Techniques, the entire contents of which are hereby incorporated by reference.

FIELD OF THE INVENTION

This invention relates to semiconductor memory integrated circuit (IC) devices, and more particularly to techniques to improve testing procedures and performance of memory IC devices.

BACKGROUND OF THE INVENTION

Technology for manufacturing memory circuits (e.g., random access memory) involves complex semiconductor production processes. These processes are not perfect insofar as memory integrated circuits (ICs) are thoroughly tested after manufacture. One aspect of memory IC testing involves testing for operating conditions of wordlines and bitlines.

In older memory technologies, wordlines are driven from both sides of the local wordline. These are called stitched wordlines. To save wafer space in newer technologies, a segmented wordline concept was introduced that drives the wordlines only from one side. This single-sided driving configuration has the disadvantage that as soon as the driven side is partially disconnected the wordline is no longer driven, and therefore will float at an undefined voltage level.

Simulation has shown that there is a voltage range in which the floating wordline behavior is most problematic. For example, in one memory technology this range is 1.3V to 1.6V. This range may vary in other memory technologies and applications. In this volatile range, the floating wordline connected memory cells can destroy or contaminate data stored in good wordline connected memory cells.

Currently, there is no practical and accurate method to characterize and test for floating wordline conditions in a memory IC chip. The only way heretofore known to tune a floating wordline test for a particular production memory chip is to use a specially-designed failure application chip and adopt a known test with the failure application chip in order to detect a floating wordline condition. If the only faulty or missing connection in the chip is a connection between a pull-down driver circuit transistor to a negative wordline voltage, it is likely that only one floating wordline will be detected even though others may be present. As a consequence, a test can be tuned or adjusted only to a particular memory chip.

What is needed is a way to design tests for floating wordlines in a memory IC chip that overcomes the shortcomings of the existing techniques.

SUMMARY OF THE INVENTION

Briefly, a memory device and methods are provided to exploit extra or dummy wordlines in the memory device. These extra wordlines are not part of a main memory area of the memory device but, when activated, connect their attached memory cells to the bitlines of the main memory area. According to one aspect, the extra wordlines are connected to a voltage in such a manner so as to simulate a floating wordline condition. Associated with each extra wordline is a driver circuit that connects the extra wordline to a voltage to allow it to charge up to the voltage, and subsequently disconnects the wordline from the voltage to allow it to float. While the extra wordline is floating, measurements may be made on the memory device to gather data useful for designing tests for floating word line conditions in production memory chips.

A controlled floating wordline condition may be created in this manner on one or a (selectable) plurality of extra wordlines in the memory device. Furthermore, each extra wordline may be charged to each of a plurality of voltages to simulate a floating wordline condition starting at each of the voltages. The number and identity of the extra wordlines may be selected, and the voltage to which an extra wordline is charged is also programmable or selectable.

According to another aspect, one or more extra wordlines may be activated to connect its attached memory cells to bitlines, thereby increasing the capacitance on the bitlines. This is useful during certain test mode conditions of a memory device. Alternatively, the extra wordlines may be activated on a more permanent basis to enhance performance of the memory device.

The objects and advantages of the invention will become more readily apparent when reference is made to the following description taken in conjunction with the accompanied drawings, wherein like reference numerals in the various figures are utilized to designate like components.

DETAILED DESCRIPTION

According to the techniques described herein, one or more extra wordlines in a memory cell device are configured to mimic or simulate a floating line condition useful for device characterization measurements, and in turn design tests for such conditions in production memory devices. In addition, a technique is described herein for increasing the capacitance on a bitline by activating an extra wordline having attached memory cells.

Figure 1:
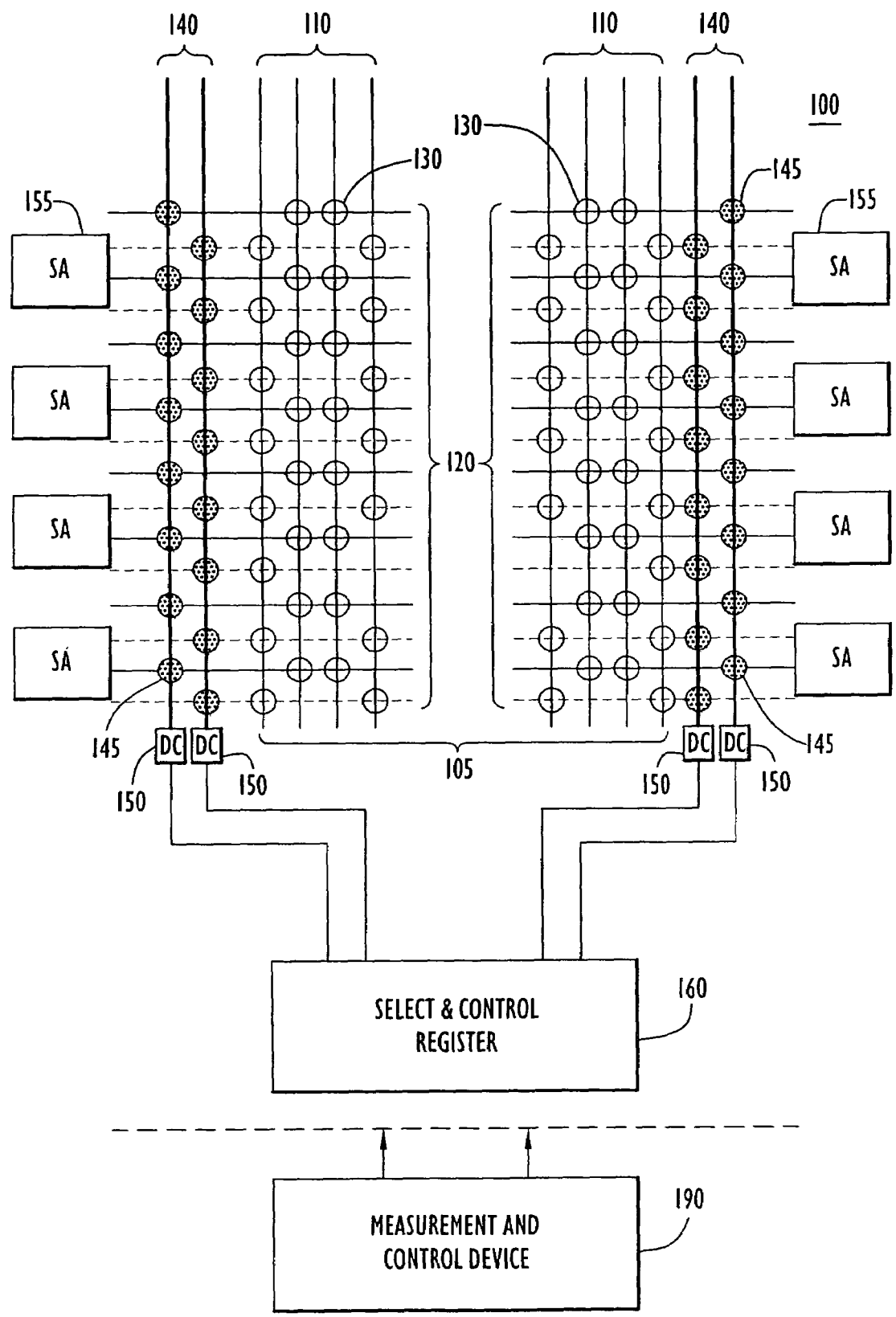
FIG. 1 is a schematic diagram showing an array of memory cells and one or more extra wordlines that are used for simulating a floating wordline condition.

Referring first to FIG. 1, a portion or segment 100 of a semiconductor memory integrated circuit (IC) device is shown. The segment 100 comprises an array or matrix 105 of wordlines (WLs) 110 and bitlines (BLs) 120 that intersect at memory cells 130 in a main memory area 105 of the segment 100. In addition, there are one or more extra or dummy wordlines 140 in the segment 100 that have attached memory cells 145 which are not part of the main memory area 105. For example, there are four extra wordlines 140 associated with the segment 100, but there may be as few as one or more than four, as desired. As appreciated by those with ordinary skill in the art, there are multiple segments in a memory IC device similar to segment 100. Associated with each extra wordline 140 is a driver circuit 150 used to activate or deactivate a wordline, thereby connecting the attached memory cells 145 on that extra wordline to a bitline 120. There are also sense amplifiers (SAs) 155 on the opposite boundaries of the segment 100.

One or more of the extra wordlines 140 may be activated. To this end, a select and control register 160 is provided that is connected to each of the driver circuits 150. The select and control register 160 supplies controls signals to the driver circuits 150 to control which one or more of the extra wordlines are activated in order to simulate a floating wordline condition on those one or more extra wordlines. The information to describe which extra wordlines are to be activated may be received at the selection and control register 160 from an off-chip measurement and control device 190.

The memory cell array layout shown in FIG. 1 is only an example. There are many other array layouts as known in the art. The techniques described herein are not limited to any particular memory cell layout.

Figure 2:
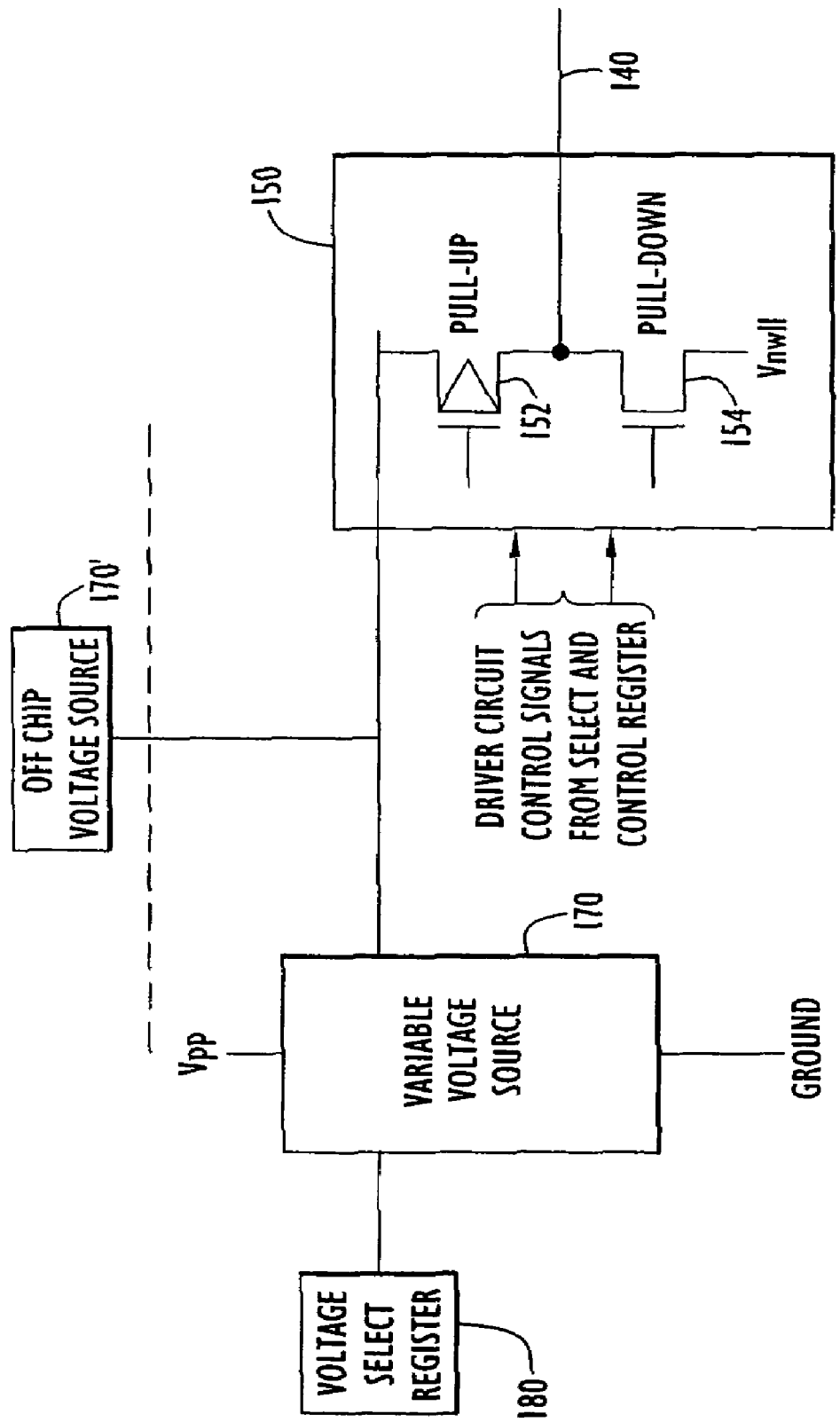
FIG. 2 is a schematic diagram of a driver circuit associated with an extra wordline that connects an extra wordline to a desirable voltage in order to simulate a floating wordline condition on the extra wordline.

Turning to FIG. 2, a driver circuit 150 is shown connected to a variable voltage source 170 that resides on the same IC as the rest of the memory device. The driver circuit 150 may be any suitable combination of transistors that can connect the extra wordline 140 to a voltage or to a negative wordline voltage $V_{nwll}$. An example is shown in which the driver circuit 150 comprises a first transistor 152 (pull-up transistor) that connects the extra wordline 140 to a voltage provided by the variable voltage source 170 and a second transistor 154 (pull-down transistor). The voltage select register 180 outputs a voltage selection signal that select the level of the voltage output by the variable voltage source 170 to the first transistor 152. For each wordline 110 in the main memory area 105 of the segment 100 there is a similar driver circuit, except that it would activate the pull-up transistor to connect the wordline 110 to an ON state voltage $V_{pp}$, or activate the pull-down transistor to connect the wordline 110 to an OFF state voltage $V_{nwll}$. In the case of the extra wordlines 140, it is desirable to connect them to a voltage that is useful for simulating a floating wordline condition. The difference is that a floating wordline does not have the pull-down connection to $V_{nwll}$. Due to pull-up transistor leakage the wordline can change its voltage level (i.e., float) and get into the critical voltage range where the wordline can cause bitline failures in the affected wordline segment. To simulate this condition, the extra wordline is not connected to $V_{nwll}$ after the extra wordline is disconnected from the voltage. The driver circuit shown in FIG. 2 is an example of a means for connecting a voltage to an extra wordline to charge the wordline to that voltage, and subsequently disconnecting the voltage from the wordline to render it in a floating condition. Driver circuit control signals to control the state of the transistors 152 and 154 in the driver circuit 150 are supplied by the select and control register 160 (FIG. 1), or any intervening control block that is in turn connected to the driver circuits 150.

For simplicity, FIG. 2 shows the supporting circuitry associated with a single extra wordline 140. Thus, there is a plurality of driver circuits 150, one for each extra wordline 140. It is to be understood that there may be a voltage select register 180 associated with each driver circuit 150 for a corresponding extra wordline 140. Similarly, there may be multiple variable voltage sources 170, one for each driver circuit 150, so that each corresponding extra wordline 140 may be charged to a selectable and if desired, different, voltage when creating the controlled floating condition. Alternatively, if all extra wordlines 140 are charged to the same voltage, then only a single variable voltage source 170 and a single voltage select register 180 are needed. Moreover, if it is desirable to create the controlled floating wordline condition at a single fixed voltage, then the variable voltage source 170 may be replaced by a fixed voltage source. The select and control register 160 supplies driver circuit control signals to control the state of the transistors in each of the driver circuits 150 to achieve a desired control floating wordline condition on one or more extra wordlines 140. The information to determine the voltage for the floating condition also may be received at the voltage select register 180 from the off-chip measurement and control device 190. The voltage select register 180 generates a voltage selection signal coupled to the variable voltage source 170 based on this information.

Still a further alternative is to source the voltage for the driver circuit 150 off-chip, such as from an off-chip voltage source 170' that has a connection to a bond pad of memory device IC. The off-chip voltage source 170' may be included as part of the measurement and control device 190 (FIG. 1), and may be variable in a manner similar to that described above.

Figure 3:
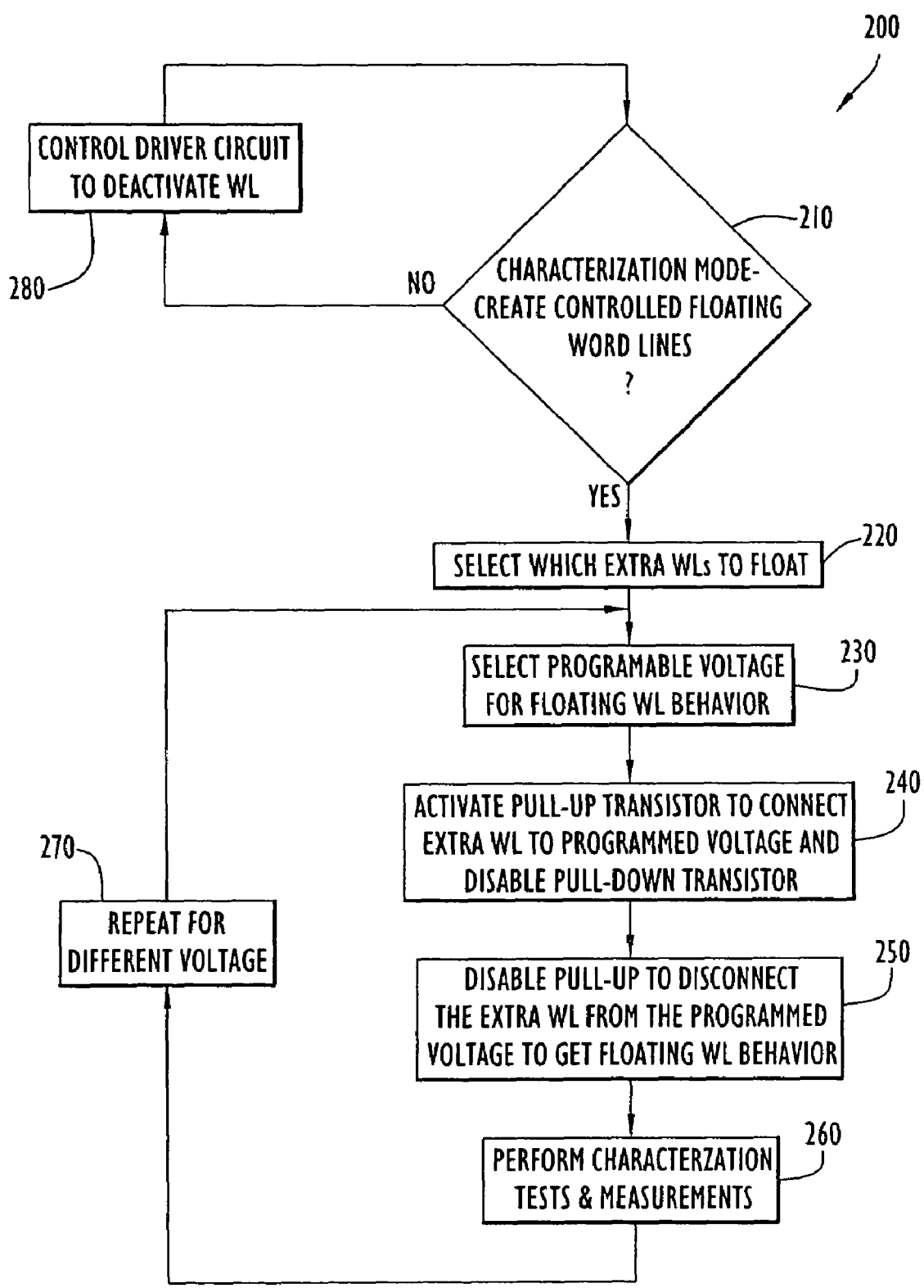
FIG. 3 is a flow chart showing a procedure for controlling the driver circuit in order to simulate a floating wordline condition on one or more extra wordlines.

Turning to FIG. 3, a process 200 for controlling the driver circuit(s) associated with an extra wordline (WL) is shown. The process 200 involves in step 210 checking to determine whether a characterization mode is invoked necessitating creation of a controlled floating condition on one or more of the extra wordlines. For normal operation when the extra wordline(s) 140 are not to be activated for floating simulation, the select and control register 160 couples a control signal to the first transistor 152 to deactivate it, thereby disconnecting it from the voltage source 170 and couples a control signal to the second transistor 154 to enable or activate it thereby connecting the extra wordline 140 to $V_{nwll}$. This keeps the extra wordline 140 deactivated and consequently disconnected from the bitlines 120.

When the characterization mode is invoked, the process 200 proceeds to step 220 in which the selection and control register 160 generates signals to determine which one or more extra wordlines are to be activated for simulating or creating a controlled floating condition. In step 230, the starting voltage to which an extra wordline is charged for simulating a floating condition is selected or programmed to the variable voltage source 170 by the voltage select register 180. The information used to make the selections in steps 220 and 230 may be received from an off-chip measurement and control device, such as the one shown in FIG. 1.

Next, in step 240, the select and control register generates control signals coupled to the driver circuit(s) of the extra wordline(s) to be floated to activate the pull-up transistor thereby connecting the extra wordline to the programmed voltage and deactivating the pull-down transistor. Thus, in step 240, the wordline is charged up to the programmed voltage. Subsequently, after a period of time sufficient to allow the extra wordline to charge to voltage, in step 250, the select and control register generates control signals coupled to the driver circuit(s) of the extra wordline(s) to be floated to deactivate the pull-up transistor thereby disconnecting the extra wordline from the voltage source 170 and deactivating the pull-down transistor to allow the wordline to have a floating wordline behavior with a starting voltage corresponding to the programmed voltage. In step 260, with the extra wordline(s) in this floating condition, measurements are made at various points in the memory circuit by way of the off-chip measurement and control device 190 (FIG. 1) to gather data useful for defining floating wordline tests in production memory chip devices. It should be understood by one with ordinary skill in the art that when the extra wordlines 140 are activated as described herein, the SAs 155 are not activated as would be the case when wordlines 110 in the main array are activated.

As shown at step 270, steps 230 through 260 are repeated for each of a plurality of voltages. The measurement and control device 190 supplies the information or instructions that the voltage select register 180 uses to generate voltage selection signals for a corresponding variable voltage source 170. For example, the measurement and control device 190 generates voltage selection signals supplied to each voltage select register 180 which in turn controls its associated variable voltage source 170 to cycle through a plurality of voltages (one at a time) in a particular range (e.g., 1.0V to 2.0V) in programmable increments or steps. Steps 230 through 260 are performed at each voltage.

Depending on the architecture of the memory device there may be different types of wordlines. For example, in a folded bitline architecture there is one wordline type connected to the bitlines and another type connected to bitlines bar (/BL). In this architecture, there would be one or more extra wordlines for both types. That is, one or more extra wordlines connected to the bitlines and another one or more extra wordlines connected to bitlines bar (/BL). To achieve different degrees of floating wordline behavior, the number of extra wordlines of the same type is programmable during the characterization mode.

To summarize, a memory device is provided comprising a plurality of memory cells; an array of wordlines and bitlines coupled to the memory cells for addressing the memory cells; at least one extra wordline having memory cells attached thereto, wherein when the at least one extra wordline is activated it connects an attached memory cell to a bitline; and a driver circuit coupled to the at least one extra wordline, wherein the driver circuit connects the at least one extra wordline to a voltage and subsequently disconnects the voltage from the extra wordline thereby simulating a floating wordline condition on the extra wordline. The simulated floating wordline condition is useful to make measurements on the device in order to design testing procedures for floating wordline conditions in a memory device.

Similarly, the foregoing provides for a method for creating testing parameters for a memory device comprising creating one or more controlled floating wordlines in a memory device; and performing measurements on the memory device while the one or more controlled floating wordlines are present. Likewise, the foregoing provides for a method for simulating a floating wordline condition in a memory device comprising connecting a wordline that is connected to a plurality of bitlines associated with memory cells in the memory device to a voltage to allow the wordline to charge to the voltage, and subsequently disconnecting the wordline from the voltage to allow the wordline to float starting at the voltage.

Figure 4:
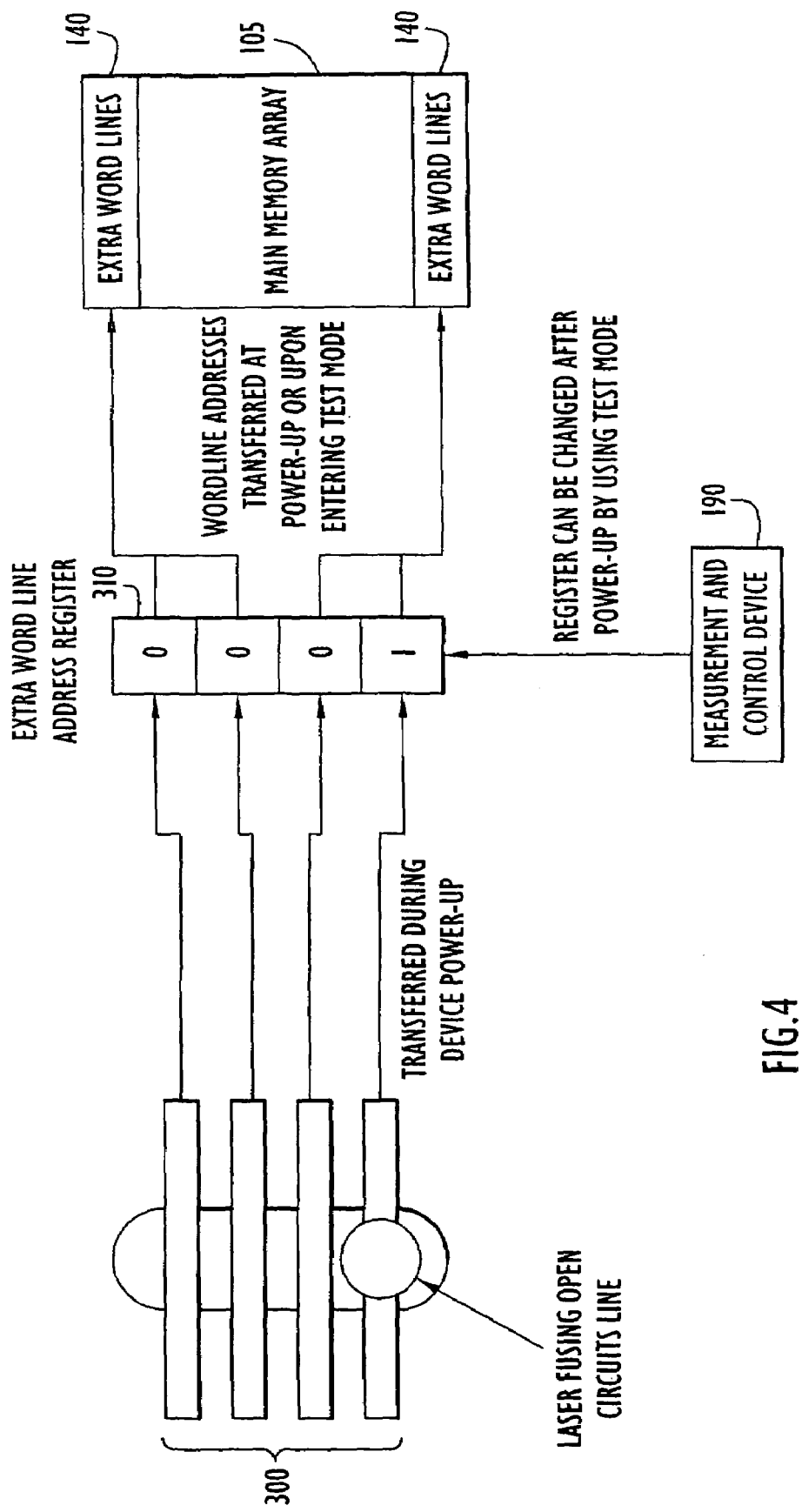
FIG. 4 is a schematic diagram showing how an extra wordline may be activated in order to add additional capacitance to a bitline.

FIG. 4 illustrates another use or application for extra wordlines in a memory IC device. Referring to FIG. 4, together with FIG. 1, one memory cell segment is shown having a main memory area 105 comprising a plurality of memory cells addressed by an array of wordlines and bitlines. On both sides of the main memory area 105 there are also extra or dummy wordlines 140 that have memory cells attached to the bitlines in the main memory area 105, similar to that shown in more detail in FIG. 1. There is also an extra wordline address register 310 to store a bit pattern used to determine which extra wordlines are made active. The bit pattern stored in the extra wordline address register 310 may be sourced from an off-chip measurement and control device 190 or from a laser fuse bank 300.

One purpose of the configuration shown in FIG. 4 is to introduce additional capacitance on a bitline by connecting a memory cell on an activated extra wordline to the bitline when that bitline is being measured for capacitive imbalance. This is useful for signal margin tests during production testing as well as for electrical failure analysis. It is also possible that the additional capacitance be enabled permanently to enhance performance of the memory device.

With reference to FIG. 4 together with FIG. 1, operation of this configuration will be described. The default state of the register 310 and the extra wordlines is a deactivated state. When testing a memory device, the off-chip measurement and control device 190 writes a bit pattern to the extra wordline address register 310 that causes activation of one or more extra wordlines associated with the main memory area 105. One or more extra wordlines 140, corresponding to the pattern stored in the register 310, are activated causing the memory cells attached to them to connect to the corresponding bitlines 110 in the main memory area 105. In this sense, the register 310 acts like the select and control register 160. When an extra wordline is activated, the memory cells attached to it connect to a bitline thereby increasing the capacitance on that bitline for as long as the test mode is active.

Under some circumstances, it may be desirable to permanently activate one or more extra wordlines connected to the bitlines in the main memory area 105. To this end, one or more fuses in the fuse bank 300 may be triggered to open (by known laser fusing techniques) that in turn cause transfer of a corresponding bit pattern to the extra wordline address register 310 during device power up to activate the corresponding one or more extra wordlines. The content of the register 310 may be changed and overridden after power-up by an external test device, such as the measurement and control device 190. The extra wordlines 140 are activated by driver circuits (DCs) similar to driver circuits shown in FIG. 1, except that the driver circuits 150 would be operated in a normal mode for activation, not to simulate a floating condition.

To summarize, a method is provided for modifying a capacitance of a bitline of a memory device comprising a plurality of memory cells addressed by a matrix of wordlines and bitlines, comprising activating at least one extra wordline to connect an memory cell attached to the extra wordline to a bitline thereby increasing a total capacitance of the bitline. Similarly, a memory device is provided comprising a plurality of memory cells in a main memory area; an array of wordlines and bitlines coupled to the memory cells for addressing the memory cells in the main memory area; and at least one extra wordline outside of the main memory area and having memory cells attached thereto, wherein when activated the extra wordline connects its memory cells to the bitlines in the main memory area thereby increasing the capacitance on the bitlines.

The system and methods described herein may be embodied in other specific forms without departing from the spirit or essential characteristics thereof. The foregoing embodiments are therefore to be considered in all respects illustrative and not meant to be limiting.

What is claimed is:

1. A method for creating testing parameters for a memory device comprising:
   a. creating one or more controlled floating wordlines in a memory device;
   b. performing measurements on the memory device while the controlled floating wordlines are present; and c. creating and/or adjusting testing procedures for a real floating wordline in a memory device based on the measurements.

2. A method for creating testing parameters for a memory device comprising:
   a. creating one or more controlled floating wordlines in a memory device, wherein creating comprises connecting at least one extra wordline, that is not part of a main memory area but is connected to bitlines in the main memory area, to a voltage and subsequently disconnecting the at least one extra wordline from the voltage to simulate a floating wordline behavior; and
   b. performing measurements on the memory device while the controlled floating wordlines are present.

3. The method of claim 2, wherein the connecting and disconnecting are repeated for each of a plurality of voltages to simulate a floating wordline behavior at each of the plurality of voltages.

4. The method of claim 2, wherein the connecting comprises connecting a plurality of extra wordlines, that are not part of a main memory area but are each connected to bitlines of the main memory area, each to a voltage, and the disconnecting comprises subsequently disconnecting the plurality of extra wordlines from the voltage in order to simulate a floating wordline condition on each of the plurality of extra wordlines.

5. The method of claim 4, wherein the connecting and disconnecting are repeated for each of a plurality of voltages for each of the plurality of extra wordlines to simulate a floating wordline condition on each of the plurality of extra wordlines starting at each of the plurality of voltages.

6. A method for creating testing parameters for a memory device comprising:
   a. creating one or more controlled floating wordlines in a memory device, wherein creating comprises selecting one or more of a plurality of extra wordlines, that are not part of a main memory area but are each connected to bitlines of the main memory area, to be connected to a voltage and subsequently disconnected from the voltage in order to simulate a floating wordline condition on each of the one or more extra wordlines; and
   b. performing measurements on the memory device while the controlled floating wordlines are present.

7. A method for creating testing parameters for a memory device comprising:
   a. creating one or more controlled floating wordlines in a memory device, wherein creating comprises selecting a voltage to which an extra wordline is to be connected; and
   b. performing measurements on the memory device while the controlled floating wordlines are present.

8. A method for simulating a floating wordline condition in a memory device comprising connecting a wordline that is connected to a plurality of bitlines associated with memory cells in the memory device to a voltage to allow the wordline to charge to the voltage, and subsequently disconnecting the wordline from the voltage to allow the wordline to float starting at the voltage, wherein the connecting and disconnecting are performed with respect to an extra wordline outside of a main memory area in the memory device but connected to the plurality of bitlines of the main memory area.

9. The method of claim 8, wherein the connecting and disconnecting are performed for each of a plurality of voltages to simulate a floating condition starting at each of the plurality of voltages.

10. The method of claim 9, wherein the connecting and disconnecting are performed for a plurality of extra wordlines outside of a main memory area but connected to the plurality of bitlines of the main memory area.

11. The method of claim 10, and further comprising selecting the one or more of the plurality of extra wordlines for simulating a floating condition.

12. The method of claim 10, wherein the connecting and disconnecting are performed on the one or more extra wordlines at each of a plurality of voltages to simulate a floating wordline condition at each of the plurality of voltages.

* * * * *